United States Patent
Auger

Patent Number: 6,025,643
Date of Patent: Feb. 15, 2000

[54] DEVICE FOR DISSIPATING HEAT FROM A SEMICONDUCTOR ELEMENT

[76] Inventor: Ronald N. Auger, 34 Albert Ave., Cranston, R.I. 02905

[21] Appl. No.: 09/124,814

[22] Filed: Jul. 29, 1998

[51] Int. Cl.[7] .......................... H01L 23/02; H01L 23/48; H05K 7/20

[52] U.S. Cl. .......................... 257/706; 257/721; 257/667; 257/697; 257/722; 257/712; 361/697; 361/702; 361/703

[58] Field of Search ..................... 257/497, 706, 257/692, 693, 712, 713, 707, 730, 722, 697, 675; 361/697, 702, 703

[56] References Cited

U.S. PATENT DOCUMENTS

| | | | |
|---|---|---|---|
| 3,261,396 | 7/1966 | Trunk | 257/722 |
| 4,644,385 | 2/1987 | Nakanishi et al. | 257/697 |
| 4,970,781 | 11/1990 | Chang et al. | 257/697 |
| 5,155,579 | 10/1992 | Au Yeung | 257/722 |
| 5,260,514 | 11/1993 | Fruen, Jr. | 257/697 |
| 5,369,301 | 11/1994 | Hayeshi et al. | 257/722 |
| 5,387,815 | 2/1995 | Nishiguchi | 257/722 |
| 5,396,947 | 3/1995 | Itoh | 165/104.14 |
| 5,525,835 | 6/1996 | Nishiguchi | 257/722 |
| 5,552,634 | 9/1996 | Schneider | 257/718 |
| 5,574,311 | 11/1996 | Matsuda | 257/697 |
| 5,693,981 | 12/1997 | Schneider et al. | 257/722 |
| 5,814,536 | 9/1998 | Rostoker et al. | 438/122 |
| 5,892,514 | 11/1998 | Smith et al. | 257/722 |

*Primary Examiner*—Alexander Oscar Williams
*Attorney, Agent, or Firm*—Perman & Green, LLP

[57] ABSTRACT

A heat sink is constructed in accordance with this invention to increase the spacing surrounding radiating pins which extend outward from a base at the region of highest thermal stress, and to increase the mass of the radiating pins a distance from said region of highest thermal stress to enhance the effects of a thermal differential.

7 Claims, 4 Drawing Sheets

DEVICE FOR DISSIPATING HEAT FROM A SEMICONDUCTOR ELEMENT

BACKGROUND OF THE INVENTION

Semiconductor elements are becoming more and more versatile and have been miniaturized in the extreme. Integrated circuits have become packed with elements and functions. With these advances, the elements are generating more and more heat due to the density and high speed of the operations. It is not unusual now to encounter thermal energy in the amount of 10 watts per square centimeter and this is expected to increase further in the future.

The heat generation is further aggravated by the density of elements mounted within a confined area. There is a need for simple and efficient heat sink configurations which can be easily manufactured. It is a purpose of this invention to create a heat sink element shaped to provide an air flow around, and a conduction path through the element which will accelerate the conduction of heat away from the semiconductor element.

As shown in FIG. 1 of U.S. Pat. No. 5,763,950, the heat sink of the prior art comprises a base 11a which is in direct contact with a surface of the semiconductor. A series of cylindrical pins 14 are mounted on the base 11a and extend perpendicular to the base. The pins form a matrix of passages through which cooling air can flow and dissipate heat conducted to the pins by convection. In addition, the pins 14 will conduct heat away from the base 11a because of the temperature differential between the base and ambient air. The material will perform in accordance with its Coefficient of Thermoconductivity and is selected accordingly. In the past improvements were sought in the efficiency of heat extraction through the construction of extended surface areas such as fins on the pins. The fins could be longitudinally extending or transverse to the axis of the pin. The sole purpose of these designs was to create more surface area over which the ambient air may flow by convection. In addition, as in the case of the '950 patent, a supplemental air flow is injected to augment convection.

SUMMARY OF THE INVENTION

A heat sink is constructed with heat dissipating pins extending upward from a base. The pins are connected to the base at the root and extend substantially perpendicular outward to the tip of the pin. Each pin is shaped with a gradually increasing cross section from its root to its tip. One such shape would approximate an inverted truncated cone having a cross sectional area at its base which is smaller than the cross sectional area of its tip.

DESCRIPTION OF THE DRAWING

The invention of this application is described in more detail below with reference to the Drawing in which.

DESCRIPTION OF THE PREFERRED EMBODIMENT

A heat sink 1 is constructed with radiating pins 3 extending outward from a base 2. In accordance with this invention the spacing surrounding radiating pins 3, in the region of highest thermal stress is increased and the mass of pin 3 away from said region is enlarged. The heat sink 1 is generally constructed for use with electronic elements, but may have more general usefulness wherever heat dissipation is needed.

A matrix of cooling pins 3 are mounted on a platform or base 2 to form heat sink 1. The heat sink 1 may be made by several methods, but the preferred process is by investment casting. The base 2 is of a generally planar shape depending on the electronic element being cooled. The base is attached to the element, which is likely to be a semiconductor, such as an integrated circuit, in manner which promotes thermal conduction away from the element.

Figure 1:
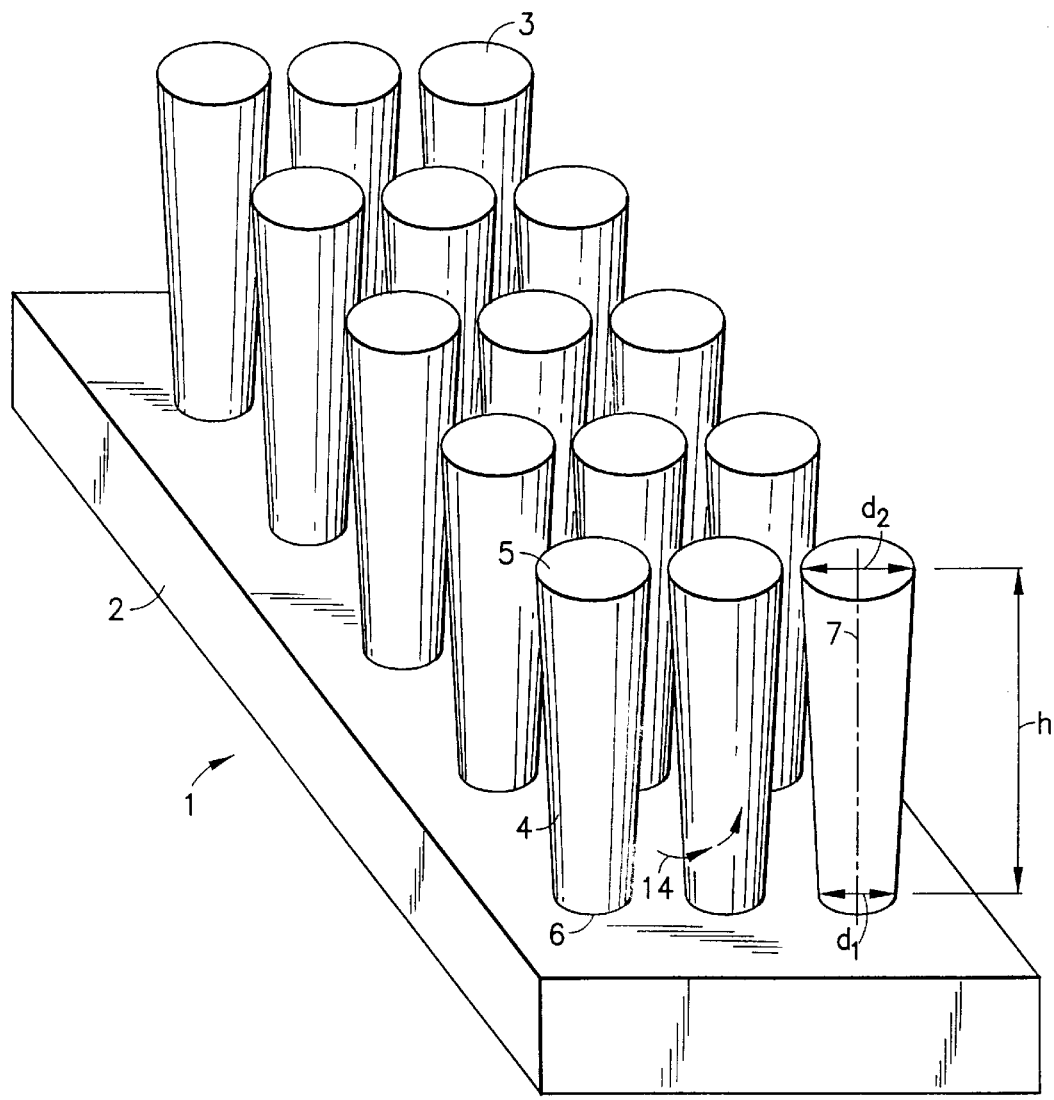
FIG. 1 is a perspective view of a heat sink made in accordance with this invention.
Figure 2:
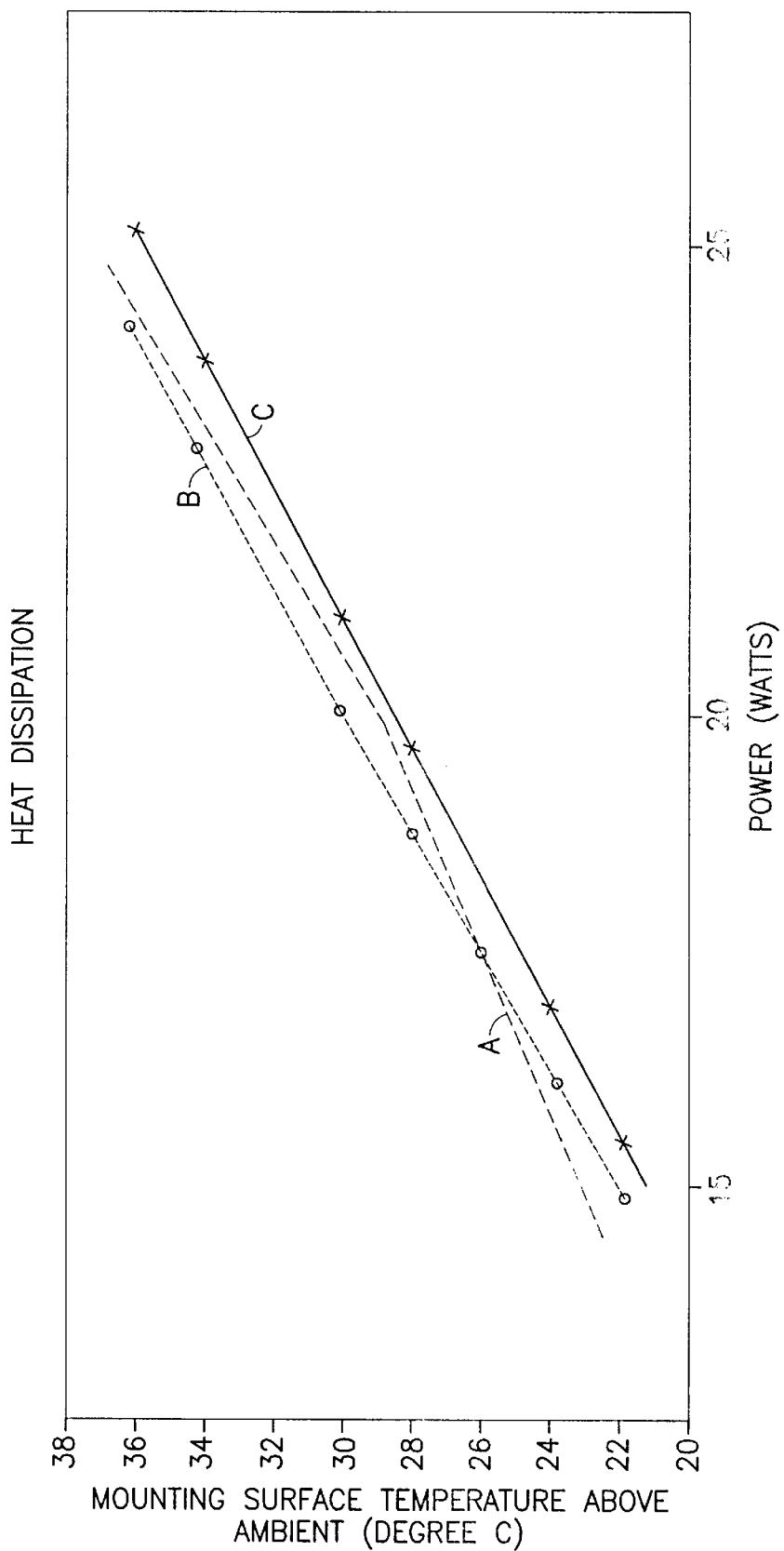
FIG. 2 is a graph of the thermal resistance of two pin configurations of the prior art and the pin configuration of the invention.

Pins 3 are attached to the base 2 and extend outward therefrom, as shown in FIG. 1. Each of pins 3 are designed with an unusual shape having a body 4, root 6, and tip 5. The body 4, shown in FIG. 1, is formed in the shape of an inverted truncated cone having the smaller cross sectional area at its root 6 and the larger cross sectional area at its tip 5. It is observed that this increases the surface area of the pin over a simple cylindrical design and expands the space available for the flow of cooling air at the base where the temperature is the hottest. The key feature is the use of the small area at the root which expands as the pin 3 extends outward from the base 2. This tends to facilitate conduction of heat away from the base 2. Since conduction is dependent on cross sectional area and the temperature differential, the increased cross sectional area in the portion of the pin which is at the lowest relative temperature will enhance the heat flow towards that region. As shown in FIG. 1, pin 3 is constructed having a height above base 2 of h and a diameter $d_1$ at the root and $d_2$ at its tip, where $d_1 < d_2$ and the transition from $d_1$ to $d_2$ is graduated in a tapered or stepped manner.

This can be accomplished in many ways, such pins having rectangular or triangular cross sections. It is generally accepted that in order to increase the cooling efficiency of cooling pins or fins, it was necessary to expand the surface area of the pins exposed to the convection air flow. With this invention, there are alternative methods, namely; to expand the open space about the root 6 of the pin 3 to accommodate a larger volume of ambient air; and to increase the cross sectional area of the conductive path to accommodate the existing temperature differential. This air will tend to flow outward by convection in the general path of air flow arrow 14 and heat will be conducted from base 2 up through pin 3. In the tests performed, identical blocks of aluminum were used as the substrate and each were heated through a predetermined thermal cycle. The inverted cone shape of pin 3 in FIG. 1 showed an approximately 4% improvement over conventional alternatives. This data set forth below indicates the results of thermal resistance tests on heat sinks of substantially identical mass which includes; an upright cone A, a cylinder B, and the inverted cone C:

| POWER (WATTS) "A" | TIME (MIN) "B" | HEATSINK II(DEG. C.) "C" | AMBIENT AIR I(DEG. C) "D" | DEG. C ABOVE AMBIENT C − D = "E" | AIR VELOCITY (FT/MIN) "F" | THERMAL RESISTANCE (DEG. C./WATT) F/A = "G" |
|---|---|---|---|---|---|---|
| (A) Upright Cone | | | | | | |
| 15 0 | 09:08:55 | 45.06 | 21.75 | 23.31 | 400 | 1.55 |
| 20 0 | 09:39:24 | 50.75 | 22.00 | 28.75 | 400 | 1.44 |
| 25 0 | 10:10:06 | 57.94 | 21.75 | 36.19 | 400 | 1.45 |
| (B) Cylinder | | | | | | |
| 15 0 | 12:31:24 | 44.06 | 22.00 | 22.06 | 400 | 1.47 |
| 20 0 | 12:57:26 | 51.25 | 21.75 | 29.50 | 400 | 1.46 |
| 25 0 | 13:32:35 | 58.44 | 22.00 | 36.44 | 400 | 1.46 |
| (C) Inverted Cone | | | | | | |
| 15 0 | 10:55:34 | 43.31 | 22.00 | 21.31 | 400 | 1.42 |
| 20 0 | 11:16:00 | 50.25 | 21.75 | 28.50 | 400 | 1.42 |
| 25 0 | 11:41:40 | 57.50 | 21.75 | 35.75 | 400 | 1.43 |

Figure 3:
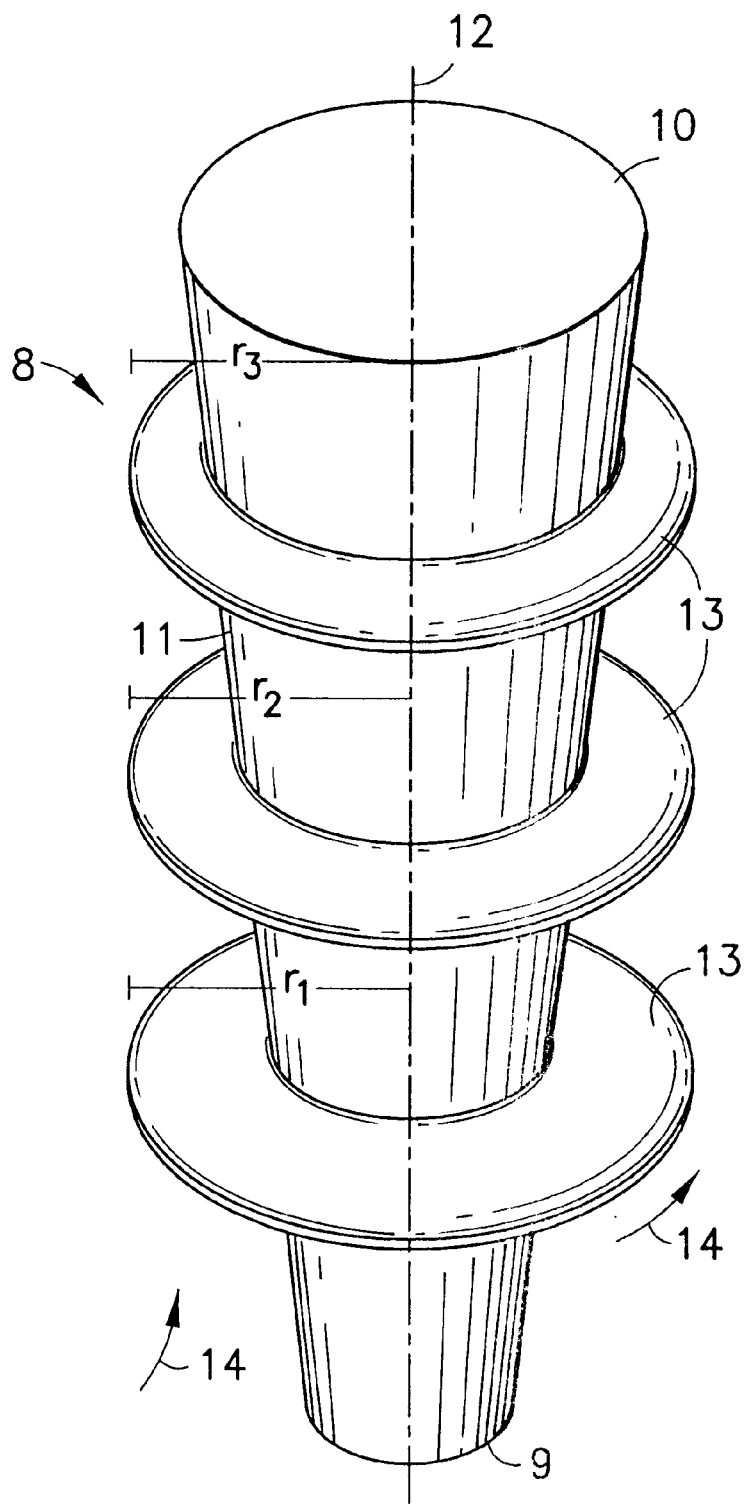
FIG. 3 is a first alternative embodiment of the pin design of this invention.

The data above is illustrated for comparative purposes in FIG. 3, when compared to pins formed as an upright cone (line A on the graph) or as a straight cylinder (line B on the graph), the inverted truncated conical pin of this invention (line C of the graph) maintained the base 2 consistently cooler through out the test. This is true even though the surface area of the upright cone is identical to the inverted design of this invention. It is believed that the improvement in thermal efficiency has resulted from the increased space available around the root of the pin which allows a greater volume of cooling air to flow over the root where the temperature will be the greatest, and the promotion of heat flow by virtue of their increasing cross sectional area of the pins in the direction of lower temperatures.

A majority of the heat sinks available are extruded, this limits the shape to relatively flat fins extending in straight lines, or die casting which requires substantial draft and that the pins be smaller at their tip than at their base resulting in lesser performance, such as the cylindrical pin or upright cone. The heat sink 1 of the subject invention may be advantageously manufactured by investment casting using thermoplastic trees or pins molded in the desired shape and attached to a base. In this manner the manufacture can be accomplished in a simple, accurate, and repeatable process.

In FIG. 3, an alternative embodiment of the pin 3 is shown. Pin 8 is constructed having a root 9, a tip 10 and a body 11. The body 11 is symmetrically formed about an axis 12 and has a diameter $d_{10}$ at its root 9 and a diameter $d_{12}$ at its tip 10, where $d_{10} < d_{12}$ and the transition from one to the other is graduated in a tapered or stepped manner. At predetermined intervals along the axis 12, transverse fins 13 are constructed extending outward from body 11 of pin 8. Although these fins are shown in FIG. 3 as having a substantially uniform radii $r_1, r_2, r_3$, it may be advantageous to construct the fins 13 having graduated radii such that $r_1 < r_2 < r_3$, consistent with the design of body 8. The fins 13 provide increased surface area for exposure to the convection air current and can be in any shape limited only by the manufacturing technique employed.

Figure 4:
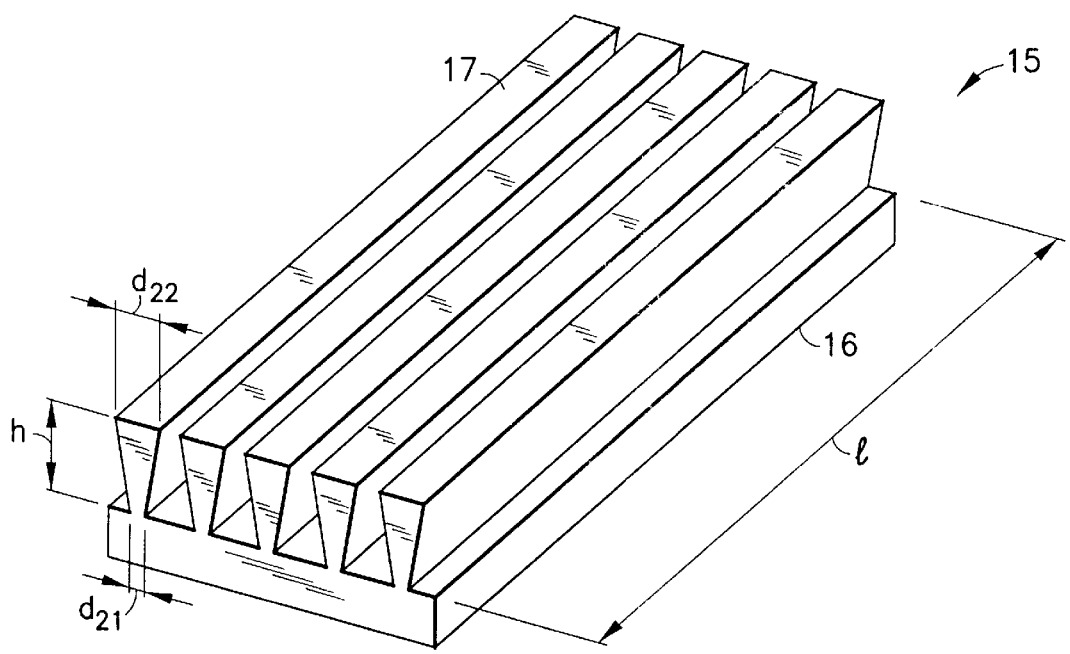
FIG. 4 is a second alternative embodiment of the pin design of this invention.

FIG. 4 shows another alternative embodiment that enables a heat sink 15 to be extended. Heat sink 15 consists of a base 16 from which elongated fins 7 extend. Fins 17 are dovetailed in cross section. Each fin 17 has a length L and a height h with a root 18 and a tip 19. This fin 17 has a width $d_{21}$ at the root 18 and a width $d_{22}$ at its tip 19, where $d_{21} < d_{22}$.

In this manner a more efficient heat sink is constructed which provides for an increased volume of air to flow at the hotter portion of the element, namely at the root of the outward radiating pins and which provides for enhanced conduction away from the base. The construction of pins according to this invention is generally contrary to prior art conceptions in which the restriction of the pin at and from its connection to the base would result in a hindrance of the thermal conduction away from the base and semiconductor element. It would have been more consistent with prior experience for the area of the junction to be expanded. The test results indicated above negates this misconception and supports the extent of the improvement in the art provided by this invention.

I claim:

1. An element for dissipating heat generated by electronic components said element exposed to ambient air circulating by convection or other means comprising:

a base member constructed to engage the component from which heat is to be dissipated in a thermally conductive manner; and a a plurality of pin members attached in thermally conductive relation to the base member and extending outward therefrom; each of the pin members having a longitudinal axis and a transverse dimension and further comprising:

a root, at which the attachment to the base member occurs, said root having a first transverse dimension;

a body, extending outward from the root and having a varying transverse dimension;

a tip forming the outer end of the pin member a predetermined distance from the root, said tip having a second transverse dimension; and wherein the first transverse dimension is smaller than the second transverse dimension and the transverse dimension of the body expands continuously in a graduated manner from said first to said second, resulting in a smaller pin cross sectional area at the root than at the tip.

2. An element for dissipating heat generated by electronic components said element exposed to ambient air circulating by convection or other means as described in claim 1 wherein the pin member further comprises:

a plurality of fin members positioned axially displaced on the body and extending transversely, outward from the body to increase the surface area of the body exposed to the circulating air.

3. An element for dissipating heat generated by electronic components said element exposed to ambient air circulating by convection or other means comprising:

a base member constructed to engage the component from which heat is to be dissipated in a thermally conductive manner; and a plurality of elongated pin members having a root and a tip, said pin members attached at its root in thermally conductive relation to the base member and extending outward therefrom to its tip; wherein the pin members are positioned and constructed to allow a larger space for air to circulate among adjacent pins at their roots than at their tips.

4. An element for dissipating heat generated by electronic components said element exposed to ambient air circulating by convection or other means comprising:

a base member constructed to engage the component from which heat is to be dissipated in a thermally conductive manner; and a plurality of elongated pin members having a root and a tip, said pin members attached at its root in thermally conductive relation to the base member and extending outward therefrom to its tip; wherein the pin members are constructed having a continuously, increasingly, greater mass as the pin member extends away from the heat to be dissipated.

5. An element for dissipating heat generated by electronic components said element exposed to ambient air circulating by convection or other means as described in claim 3 wherein the pin members are also constructed to provide an increasingly greater mass as the pin member extends away from the hear to be dissipated.

6. An element for dissipating heat generated by electronic components said element exposed to ambient air circulating by convection or other means, as described in claim 1, wherein said cross sectional area is circular and said transverse dimension is a diameter.

7. An element for dissipating heat generated by electronic components said element exposed to ambient air circulating by convection or other means, as described in claim 4, wherein each pin is constructed in the shape of an inverted truncated cone.

* * * * *